United States Patent
Linthicum et al.

(10) Patent No.: US 6,376,339 B2
(45) Date of Patent: *Apr. 23, 2002

(54) PENDEOEPITAXIAL METHODS OF FABRICATING GALLIUM NITRIDE SEMICONDUCTOR LAYERS ON SILICON CARBIDE SUBSTRATES BY LATERAL GROWTH FROM SIDEWALLS OF MASKED POSTS, AND GALLIUM NITRIDE SEMICONDUCTOR STRUCTURES FABRICATED THEREBY

(75) Inventors: Kevin J. Linthicum, Angier; Thomas Gehrke, Carrboro; Darren B. Thomson, Cary; Eric P. Carlson, Raleigh; Pradeep Rajagopal, Raleigh; Robert F. Davis, Raleigh, all of NC (US)

(73) Assignee: North Carolina State University, Raleigh, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/780,072

(22) Filed: Feb. 9, 2001

Related U.S. Application Data

(62) Division of application No. 09/717,717, filed on Nov. 22, 2000, which is a continuation of application No. 09/198,784, filed on Nov. 24, 1998, now Pat. No. 6,177,688.

(51) Int. Cl.$^7$ .............................................. H01L 21/20
(52) U.S. Cl. ...................................................... 438/479
(58) Field of Search ............................. 438/22, 24, 39, 438/40, 41, 42, 43, 44, 46, 47, 478, 503, 507, 481, 483

(56) References Cited

U.S. PATENT DOCUMENTS 4,127,792 A 11/1978 Nakata ....................... 313/500
4,522,661 A 6/1985 Morrison et al. .......... 148/33.2

(List continued on next page.)

FOREIGN PATENT DOCUMENTS

CA 2258080 10/1998
EP 0 551 721 A2 7/1993

(List continued on next page.)

OTHER PUBLICATIONS

Naritsuka et al., Epitaxial Lateral Overgrowth of InP by Liquid Phase Epitaxy, Journal of Crystal Growth, vol. 146, 1995, pp. 314–318.

*Primary Examiner*—Savitri Mulpuri
(74) *Attorney, Agent, or Firm*—Myers Bigel Sibley & Sajovec

(57) ABSTRACT

An underlying gallium nitride layer on a silicon carbide substrate is masked with a mask that includes an array of openings therein, and the underlying gallium nitride layer is etched through the array of openings to define posts in the underlying gallium nitride layer and trenches therebetween. The posts each include a sidewall and a top having the mask thereon. The sidewalls of the posts are laterally grown into the trenches to thereby form a gallium nitride semiconductor layer. During this lateral growth, the mask prevents nucleation and vertical growth from the tops of the posts. Accordingly, growth proceeds laterally into the trenches, suspended from the sidewalls of the posts. The sidewalls of the posts may be laterally grown into the trenches until the laterally grown sidewalls coalesce in the trenches to thereby form a gallium nitride semiconductor layer. The lateral growth from the sidewalls of the posts may be continued so that the gallium nitride layer grows vertically through the openings in the mask and laterally overgrows onto the mask on the tops of the posts, to thereby form a gallium nitride semiconductor layer. The lateral overgrowth can be continued until the grown sidewalls coalesce on the mask to thereby form a continuous gallium nitride semiconductor layer. Microelectronic devices may be formed in the continuous gallium nitride semiconductor layer.

39 Claims, 4 Drawing Sheets

U.S. PATENT DOCUMENTS

| | | | |
|---|---|---|---|
| 4,651,407 A | 3/1987 | Bencuya | 29/571 |
| 4,865,685 A | 9/1989 | Palmour | 156/643 |
| 4,876,210 A | 10/1989 | Barnett et al. | 437/5 |
| 4,912,064 A | 3/1990 | Kong et al. | 437/100 |
| 4,946,547 A | 8/1990 | Palmour et al. | 156/643 |
| 5,122,845 A | 6/1992 | Manabe et al. | 357/17 |
| 5,156,995 A | 10/1992 | Fitzgerald, Jr. et al. | 437/90 |
| RE34,861 E | 2/1995 | Davis et al. | 437/100 |
| 5,389,571 A | 2/1995 | Takeuchi et al. | 437/133 |
| 5,397,736 A | 3/1995 | Bauser et al. | 437/92 |
| 5,549,747 A | 8/1996 | Bozler et al. | 117/43 |
| 5,710,057 A | 1/1998 | Kenney | 437/62 |
| 5,760,426 A | 6/1998 | Marx et al. | 257/190 |
| 5,786,606 A | 7/1998 | Nishio et al. | 257/103 |
| 5,815,520 A | 9/1998 | Furushima | 372/45 |
| 5,877,070 A | 3/1999 | Goesele et al. | 438/458 |
| 5,880,485 A | 3/1999 | Marx et al. | 257/94 |
| 5,912,477 A | 6/1999 | Negley | 257/95 |
| 5,915,194 A | 6/1999 | Powell et al. | 438/478 |
| 6,051,849 A | 4/2000 | Davis | 257/103 |
| 6,064,078 A | 5/2000 | Northrup et al. | 257/96 |
| 6,100,104 A | 8/2000 | Haerle | 438/33 |
| 6,100,111 A | 8/2000 | Konstantinov | 438/92 |
| 6,121,121 A | 9/2000 | Koide | 438/481 |
| 6,153,010 A | 11/2000 | Kiyoku et al. | 117/95 |
| 6,156,584 A | 12/2000 | Itoh et al. | 438/33 |
| 6,255,198 B1 * | 7/2001 | Linthicum et al. | 438/481 |
| 6,265,289 B1 * | 7/2001 | Zheleva et al. | 438/503 |

FOREIGN PATENT DOCUMENTS

| | | |
|---|---|---|
| EP | 0 852 416 A1 | 7/1998 |
| EP | 0 942 459 A1 | 9/1999 |
| EP | 0 951 055 A2 | 10/1999 |
| JP | 3-132016 | 6/1991 |
| JP | 4-188678 | 7/1992 |
| JP | 5-7016 | 1/1993 |
| JP | 5-41536 | 2/1993 |
| JP | 8-18159 | 1/1996 |
| JP | 08-064791 | 3/1996 |
| JP | 8-116093 | 5/1996 |
| JP | 8-125251 | 5/1996 |
| JP | 8-153931 | 6/1996 |
| JP | 9-93315 | 4/1997 |
| JP | 9-174494 | 6/1997 |
| JP | 9-181071 | 7/1997 |
| JP | 9-201477 | 7/1997 |
| JP | 9-277448 | 10/1997 |
| JP | 9-290098 | 10/1997 |
| JP | 9-324997 | 11/1997 |
| JP | 11-145516 | 5/1999 |
| WO | WO 97/11518 | 3/1997 |
| WO | WO 98/47170 | 10/1998 |

OTHER PUBLICATIONS

Allegretti et al., In–situ Observation of GaAs Selective Epitaxy on GaAs (111)B Substrates, Journal of Crystal Growth, vol. 146, 1995, pp. 354–358.

Allegretti et al., Periodic Supply Epitaxy: A New Approach for the Selective Area Growth of GaAs by Molecular Beam Epitaxy, Journal of Crystal Growth, vol. 156, 1995, pp. 1–10.

Sakawa et al., Effect of Si Doping on Epitaxial Lateral Overgrowth of GaAs on GaAs–Coated Si Substrate, Japanese Journal of Applied Physics, Part 2, No. 3B, Mar. 15, 1992, pp. L359–L361.

Kinoshita et al., Epitaxial Laterla Overgrowth of Si on Non–Planar Substrate, Journal of Crystal Growth, vol. 115, 1991, pp. 561–566.

Zhang et al., Epitaxial Lateral Overgrowths of GaAs on (001) GaAs Substrates by LPE: Growth Behavior and Mechanism, Journal of Crystal Growth, vol. 99, 1990, pp. 292–296.

Suzuki et al., Si LPE Lateral Overgrowth From a Ridge Seed, Japanese Journal of Applied Physics, vol. 29, No. 12, Dec., 1990, pp. 2685–2689.

Zhang et al., LPE Lateral Overgrowth of GaP, Japanese Journal of Applied Physics, vol. 29,No. 3, Mar. 1990, pp. 545–550.

Suzuki et al., Epitaxial Lateral Overgrowth of Si by LPE With Sn Solution and Its Orientation Dependence, Japanese Journal of Applied Physics, vol. 28, No. 3, Mar. 1989, pp. 440–445.

Suzuki et al., The Sources of Atomic Steps in Epitaxial Lateral Overgrowth of Si, Journal of Crystal Growth, vol. 99, 1989, pp. 229–234.

Nishinaga et al., Epitaxial Lateral Overgrowth of GaAs by LPE, Japanese Journal of Applied Physics, vol. 27, No. 6, Jun. 1988, pp. L964–L967.

U.S. application No. 09/031,843, Davis et al., filed Feb. 27, 1998.

U.S. application No. 60/088,761, Linthicum et al., filed Jun. 10, 1998.

U.S. application No. 09/327,136, Zhevela et al., filed Jun. 7, 1999.

U.S. application No. 60/109,674, Linthicum et al., filed Nov. 24, 1998.

U.S. application No. 60/109,860, Gehrke et al., filed Nov. 24, 1998.

U.S. application No. 09/441,754, Linthicum et al., filed Nov. 17, 1999.

U.S. application No. 09/198,784, Linthicum et al., filed Nov. 24, 1998.

Honda et al., Selective Area Growth of GaN Microstructures on Patterned (111) and (001) Si Substrates, 4th European Workshop on GaN, Nottingham, UK, Jul. 2–5, 2000.

Gallium Nitride–2000–Technology, Status, Applications, and Market Forecasts, Strategies Unlimited, Report SC–23, May 2000.

International Search Report, PCT/US99/28056, Apr. 26, 2000.

International Search Report, PCT/US99/27358, Apr. 28, 2000.

Gehrke et al., Pendeo–Epitaxial Growth of Gallium Nitride on Silicon Substrates, Journal of Electronic Materials, vol. 29, No. 3, Mar. 2000, pp. 306–310.

Gehrke et al., Pendeo–Epitaxy of Gallium Nitride and Aluminum Nitride Films and Heterostructures on Silicon Carbide Substrate, MRS Internet J. Semicond. Res. 4S1, G3.2, 1999, 6 pp.

Thomson et al., Ranges of Deposition Temperatures Applicable for Metalorganic Vapor Phase Epitaxy of GaN Films Via the Technique of Pendeo–Epitaxy, MRS Internet J. Semicond. Res. 4S1, G3.37, 1999, 6 pp.

International Search Report, PCT/US99/12967, Oct. 18, 1999.

Chen et al., Dislocation Reduction in GaN Thin Films Via Lateral Overgrowth From Trenches, Applied Physics Letters, vol. 75, No. 14, Oct. 4, 1999, pp. 2062–2063.

International Search Report, PCT/US99/04346, Jun. 9, 1999.

Linthicum et al., Pendeoepitaxy of Gallium Nitride Thin Films, Applied Physics Letters, vol. 75, No. 2, Jul. 12, 1999, pp. 196–198.

Nakamura, InGaN–Based Violet Laser Diodes, Semicond. Sci. Technol., 14, 1999, pp. R27–R40.

Nakamura et al., Violet InGaN/GaN/AlGaN–Based Laser Diodes Operable at 50° C. With a Fundamental Transverse Mode, Jpn. J. Appl. Phys. vol. 38, Part 1, No. 3A, Mar. 1, 1999, pp. L226–L229.

Leo Unmasked by Pendeo–Epitaxy, Compound Semiconductor, Mar. 1999, p 16.

U.S. application No. 60/170,433, Gehrke et al., filed Dec. 13, 1999.

U.S. application No. 09/468,995, Linthicum et al., filed Dec. 21, 2000.

U.S. application No. 09/501,051, Linthicum et al., filed Feb. 9, 2000.

U.S. application No. 09/512,242, Gehrke et al., filed Feb. 24, 2000.

U.S. application No. 09/525,721, Davis et al., filed Mar. 14, 2000.

U.S. application No. 09/441,753, Gehrke et al., filed Nov. 17, 1999.

U.S. application No. 09/736,569, Gehrke et al., filed Dec. 13, 2000.

Zheleva et al., Pendeo–Epitaxy: A New Approach for Lateral Growth of Gallium Nitride Films, Journal of Electronic Materials, vol. 28, No. 4, Feb. 1999, pp. L5–L8.

Boo et al., Growth of Hexagonal GaN Thin Films on Si(111) with Cubic SiC Buffer Layers, Journal of Crystal Growth 189–190, 1998, pp. 183–188.

Zheleva et al., Pendeo–Epitaxy—A New Approach for Lateral Growth of GaN Structures, MRS Internet Journal of Nitride Semiconductor Research, 1999, Online!, vol. 4S1, No. G3.38, Nov. 30, 1998–Dec. 4, 1998.

Linthicum et al., Process Routes for Low–Defect Density GaN on Various Substrates Employing Pendeo–Epitaxial Growth Techniques, MRS Internet Journal of Nitride Semiconductor Research, Fall Meeting of the Materials Research Society, vol. 4S1, No. G4.9, Nov. 30, 1998–Dec. 4, 1998.

Nakamura et al., InGaN/GaN/AlGaN–Based Laser Diodes Grown on GaN Substrates With a Fundamental Transverse Mode, Jpn. J. Appl. Phys., vol. 37, Sep. 15, 1998, pp. L1020–L1022.

Marchand et al., Microstructures of GaN Laterally Overgrown by Metalorganic Chemical Vapor Deposition, Applied Physics Letters, vol. 73, No. 6, Aug. 10, 1998, pp. 747–749.

Sakai et al., Transmission Electron Microscopy of Defects in GaN Films Formed by Epitaxial Lateral Overgrowth, vol. 73, No. 4, Jul. 27, 1998, pp. 481–483.

Nakamura et al., High–Power, Long–Lifetime InGaN/GaN/AlGaN–Based Laser Diodes Grown on Pure GaN Substrates, Jpn. J. Appl. Phys., vol. 37, Mar. 15, 1998, pp. L309–L312.

Nam et al., Lateral Epitaxial Overgrowth of GaN Films on $SiO_2$ Areas Via Metalorganic Vapor Phase Epitaxy, Journal of Electronic Materials, vol. 27, No. 4, 1998, pp. 233–237.

Wu et al., Growth and Characterization of SiC Films on Large–Area Si Wafers by APCVD–Temperature Dependence, Materials Science Forum, vols. 264–268, 1998, pp. 179–182.

Nakamura, InGaN/GaN/AlGaN–Based Laser Diodes, Properties, Processing and Applications of Gallium Nitride and Related Semiconductors, EMIS Datareviews Series No. 23, 1998, pp. 587–595.

Hiramatsu et al., Selective Area Growth and Epitaxial Lateral Overgrowth of GaN, Properties, Processing and Applications of Gallium Nitride and Related Semiconductors, EMIS Datareviews Series No. 23, 1998, pp. 440–446.

Nakamura et al., InGaN/GaN/AlGaN–Based Laser Diodes With Modulation–Doped Strained–Layer Superlattices, Jpn. J. Appl. Phys., vol. 36, Dec. 1, 1997, pp. L1568–L1571.

Sakai, Defect Structure in Selectively Grown GaN Films With Low Threading Dislocation Density, Appl. Phys. Lett., vol. 71, No. 16, Oct. 20, 1997, pp. 2259–2261.

Kapolnek et al., "Anisotropic Epitaxial Lateral Growth in GaN Selective Area Epitaxy", Appl. Phys. Lett. 71 (9), Sep. 1, 1997, pp. 1204–1206.

Usui et al., "Thick GaN Epitaxial Growth With Low Dislocation Density by Hydride Vapor Phase Epitaxy", Jpn. J. Appl. Phys., vol. 36, Part 2, No. 7B, Jul. 15, 1997, pp. 899–902.

Nam et al., Lateral Epitaxy of Low Defect Density GaN Layers Via Organometallic Vapor Phase Epitaxy, Appl. Phys. Lett., vol. 71, No. 18, Nov. 3, 1997, pp. 2638–2640.

Zheleva et al., Dislocation Density Reduction Via Lateral Epitaxy in Selectively Grown GaN Structures, Appl. Phys. Lett., vol. 71, No. 17, Oct. 27, 1997, pp. 2472–2474.

Nam, et al., "Growth of GaN and $Al_{0.2}Ga_{0.8}N$ on Patterned Substrates Via Organometallic Vapor Phase Epitaxy", Jpn. J. Appl. Phys., vol. 36, Part 2, No. 5A, May 1, 1997, pp. 532–535.

Nam et al., "Selective Growth of GaN and $Al_{0.2}Ga_{0.8}N$ on GaN/AlN/6H–SiC(0001) Multilayer Substrates Via Organometallic Vapor Phase Epitaxy", Proceedings MRS, Dec. 1996, 6 pp.

Steckl et al., SiC Rapid Thermal Corbonization of the (111)Si Semiconductor–on–Insulator Structure and Subsequent Metalorganic Chemical Vapor Deposition, Appl. Phys. Let., 69 (15), Oct. 7, 1996, pp. 2264–2266.

Kapolnek et al., "Selective Area Epitaxy of GaN for Electron Field Emission Devices", Journal of Crystal Growth, 5451, 1996, pp. 1–4.

Weeks et al, "GaN Thin Films Deposited Via Organometallic Vapor Phase Epitaxy on $\alpha(6H)$–SiC(0001) Using High–Temperature Monocrystalline AlN Buffer Layers", Appl. Phys. Lett. 67 (3), Jul. 17, 1995, pp. 401–403.

Doverspike et al., The Effect of GaN and AlN Buffer Layers on GaN Film Properties Grown on Both C–Plane and A–Plane Sapphire, Journal of Electronic Materials, vol. 24, No. 4, 1995, pp. 269–273.

Kato et al., "Selective Growth of Wurtzite GaN and $Al_xGa_{1-x}N$ on GaN/Sapphire Substrates by Metalorganic Vapor Phase Epitaxy", Journal of Crystal Growth, 144, 1994, pp. 133–140.

Kuznia et al., Influence of Buffer Layers on the Deposition of High Quality Single Crystal GaN Over Sapphire Substrates, J. Appl. Phys., vol. 73, No. 9, May 1, 1993, pp. 4700–4702.

Gustafsson et al., Investigations of High Quality $Ge_xSi_{l-x}$ Grown by Heteroepitaxial Lateral Overgrowth Using Cathoduluminescence, Inst. Phys. Conf. Ser. No. 134: Section 11, Micros. Semicond. Mater. Conf., Oxford, Apr. 5–8, 1993, pp. 675–678.

Watanabe et al., The Growth of Single Crystalline GaN on a Si Substrate Using AlN As An Intermediate Layer, Journal of Crystal Growth, vol. 128, 1993, pp. 391–396.

Yamaguchi et al, Lateral Supply Mechanisms in Selective Metalorganic Chemical Vapor Deposition, Jpn. Appl. Phys., vol. 32 (1993), pp. 1523–1527.

Nakamura, GaN Growth Using GaN Buffer Layer, Japanese Journal of Applied Physics, vol. 30, No. 10A, Oct. 1991, pp. L1705–L1707.

Givargizov, Other Approaches to Oriented Crystallization on Amorphous Substrates, Chapter 4, Oriented Crystallization on Amorphous Substrates, Plenum Press, 1991, pp. 221–264.

Akasaki et al., Effects of AlN Buffer Layer on Crystallographic Structure and on Electrical and Optical Properties of GaN and $Ga_{1-x}Al_xN$ ($0<x\leq0.4$) Films Grown on Sapphire Substrate by MOVPE, Journal of Crystal Growth, vol. 98, 1989, pp. 209–219.

Ujiie et al., Epitaxial Lateral Overgrowth of GaAs on a Si Substrate, Jpn. J. Appl. Phys., vol. 28, 1989, p. L337–L339.

Chen et al., Silicon–on–Insulator: Why, How, and When, AIP Conference Proceedings, vol. 167, No. 1, Sep. 15, 1988, pp. 310–319.

Amano et al., Metalorganic Vapor Phase Epitaxial Growth of a High Quality GaN Film Using an AlN Buffer Layer, Applied Physics Letters, vol. 48, No. 5, Feb. 3, 1986, pp. 353–355.

Ishiwara et al., Lateral Solid Phase Epitaxy of Amorphous Si Films on Si Substrates With $SiO_2$ Patterns, Applied Physics Letters, vol. 43, No. 11, Dec. 1, 1983, pp. 1028–1030.

Yoshida et al., Improvements on the Electrical and Luminescent Properties of Reactive Molecular Beam Epitaxially Grown GaN Films by Using AlN–Coated Sapphire Substrates, Applied Physics Letters, vol. 42, No. 5, Mar. 1, 1983, pp. 427–429.

Jastrzebski, SOI by CVD: Epitaxial Lateral Overgrowth (ELO) Process–Review, Journal of Crystal Growth, vol. 63, 1983, pp. 493–526.

Rathman et al., Lateral Epitaxial Overgrowth of Silicon on $SiO_2$, Journal of the Electrochemical Society, Oct. 1982, pp. 2303–2306.

Shaw, Selective Epitaxial Deposition of Gallium Arsenide in Holes, Journal of Electrochemical Society, Sep. 1966, pp. 904–908.

Tausch, Jr. et al., A Novel Crystal Growth Phenomenon: Single Crystal GaAs Overgrowth Onto Silicon Dioxide, Journal of the Electrochemical Society, Jul. 1965, pp. 706–709.

Joyce et al., Selective Epitaxial Deposition of Silicon, Nature, vol. 4840, Aug. 4, 1962, pp. 485–486.

Hiramatsu et al., Growth Mechanism of GaN Grown on Sapphire With AlN Buffer Layer by MOVPE, Journal of Crystal Growth, vol. 115, 1991, pp. 628–633.

* cited by examiner

PENDEOEPITAXIAL METHODS OF FABRICATING GALLIUM NITRIDE SEMICONDUCTOR LAYERS ON SILICON CARBIDE SUBSTRATES BY LATERAL GROWTH FROM SIDEWALLS OF MASKED POSTS, AND GALLIUM NITRIDE SEMICONDUCTOR STRUCTURES FABRICATED THEREBY

CROSS REFERENCE TO RELATED APPLICATIONS

This application is a divisional of application Ser. No. 09/717,717, filed Nov. 22, 2000, entitled Pendeoepitaxial Methods of Fabricating Gallium Nitride Semiconductor Layers on Silicon Carbide Substrates by Lateral Growth From Sidewalls of Masked Posts, and Gallium Nitride Semiconductor Structures Fabricated Thereby, which is itself a continuation of application Ser. No. 09/198,784, filed Nov. 24, 1998 (now U.S. Pat. No. 6,177,688) entitled Pendeoepitaxial Gallium Nitride Semiconductor Layers on Silicon Carbide Substrates, assigned to the assignee of the present invention, the disclosures of which are hereby incorporated herein by reference.

Federally Sponsored Research

This invention was made with Government support under Office of Naval Research Contract Nos. N00014-96-1-0765, N00014-98-1-0384, and N00014-98-10654. The Government may have certain rights to this invention.

FIELD OF THE INVENTION

This invention relates to microelectronic devices and fabrication methods, and more particularly to gallium nitride semiconductor devices and fabrication methods therefor.

BACKGROUND OF THE INVENTION

Gallium nitride is being widely investigated for microelectronic devices including but not limited to transistors, field emitters and optoelectronic devices. It will be understood that, as used herein, gallium nitride also includes alloys of gallium nitride such as aluminum gallium nitride, indium gallium nitride and aluminum indium gallium nitride.

A major problem in fabricating gallium nitride-based microelectronic devices is the fabrication of gallium nitride semiconductor layers having low defect densities. It is known that one contributor to defect density is the substrate on which the gallium nitride layer is grown. Accordingly, although gallium nitride layers have been grown on sapphire substrates, it is known to reduce defect density by growing gallium nitride layers on aluminum nitride buffer layers which are themselves formed on silicon carbide substrates. Notwithstanding these advances, continued reduction in defect density is desirable.

It is also known to fabricate gallium nitride structures through openings in a mask. For example, in fabricating field emitter arrays, it is known to selectively grow gallium nitride on stripe or circular patterned substrates. See, for example, the publications by Nam et al. entitled "*Selective Growth of GaN and $Al_{0.2}Ga_{0.8}N$ on GaN/AlN/N6H-SiC (0001) Multilayer Substrates Via Organometallic Vapor Phase Epitaxy*", Proceedings of the Materials Research Society, December 1996, and "*Growth of GaN and $Al_{0.2}Ga_{0.8}N$ on Patterened Substrates via Organometallic Vapor Phase Epitaxy*", Japanese Journal of Applied Physics., Vol. 36, Part 2, No. 5A, May 1997, pp. L532-L535. As disclosed in these publications, undesired ridge growth or lateral overgrowth may occur under certain conditions.

SUMMARY OF THE INVENTION

It is therefore an object of the present invention to provide improved methods of fabricating gallium nitride semiconductor layers, and improved gallium nitride layers so fabricated.

It is another object of the invention to provide methods of fabricating gallium nitride semiconductor layers that can have low defect densities, and gallium nitride semiconductor layers so fabricated.

These and other objects are provided, according to the present invention, by masking an underlying gallium nitride layer on a silicon carbide substrate with a mask that includes an array of openings therein and etching the underlying gallium nitride layer through the array of openings to define a plurality of posts in the underlying gallium nitride layer and a plurality of trenches therebetween. The posts each include a sidewall and a top having the mask thereon. The sidewalls of the posts are laterally grown into the trenches to thereby form a gallium nitride semiconductor layer. During this lateral growth, the mask prevents nucleation and vertical growth from the tops of the posts. Accordingly, growth proceeds laterally into the trenches, suspended from the sidewalls of the posts. This form of growth is referred to herein as pendeoepitaxy from the Latin "to hang" or "to be suspended". Microelectronic devices may be formed in the gallium nitride semiconductor layer.

According to another aspect of the invention, the sidewalls of the posts are laterally grown into the trenches until the laterally grown sidewalls coalesce in the trenches to thereby form a gallium nitride semiconductor layer. The lateral growth from the sidewalls of the posts may be continued so that the gallium nitride layer grows vertically through the openings in the mask and laterally overgrows onto the mask on the tops of the posts, to thereby form a gallium nitride semiconductor layer. The lateral overgrowth can be continued until the grown sidewalls coalesce on the mask to thereby form a continuous gallium nitride semiconductor layer. Microelectronic devices may be formed in the continuous gallium nitride semiconductor layer.

It has been found, according to the present invention, that dislocation defects do not significantly propagate laterally from the sidewalls of the posts, so that the laterally grown sidewalls of the posts are relatively defect-free. Moreover, during growth, it has been found that significant vertical growth on the top of the posts is prevented by the mask so that relatively defect-free lateral growth occurs from the sidewalls onto the mask. Significant nucleation on the top of the posts also preferably is prevented. The overgrown gallium nitride semiconductor layer is therefore relatively defect-free.

Accordingly, the mask functions as a capping layer on the posts that forces the selective homoepitaxial growth of gallium nitride to occur only on the sidewalls. Defects associated with heteroepitaxial growth of the gallium nitride seed layer are pinned under the mask. By using a combination of growth from sidewalls and lateral overgrowth, a complete coalesced layer of relatively defect-free gallium nitride may be fabricated over the entire surface of a wafer in one regrowth step.

The pendeoepitaxial gallium nitride semiconductor layer may be laterally grown using metalorganic vapor phase epitaxy (MOVPE). For example, the lateral gallium nitride layer may be laterally grown using triethylgallium (TEG) and ammonia (NH$_3$) precursors at about 1000°–1100° C. and about 45 Torr. Preferably, TEG at about 13–39 μmol/min and NH$_3$ at about 1500 sccm are used in combination with about 3000 sccm H$_2$ diluent. Most preferably, TEG at about 26 μmol/min, NH$_3$ at about 1500 sccm and H$_2$ at about 3000 sccm at a temperature of about 1100° C. and about 45 Torr are used. The underlying gallium nitride layer preferably is formed on a substrate such as 6H-SiC(0001), which itself includes a buffer layer such as aluminum nitride thereon. Other buffer layers such as gallium nitride may be used. Multiple substrate layers and buffer layers also may be used.

The underlying gallium nitride layer including the sidewall may be formed by forming trenches in the underlying gallium nitride layer, such that the trenches define the sidewalls. Alternatively, the sidewalls may be formed by forming masked posts on the underlying gallium nitride layer, the masked posts including the sidewalls and defining the trenches. A series of alternating trenches and masked posts is preferably formed to form a plurality of sidewalls. The posts are formed such that the top surface and not the sidewalls are masked. As described above, trenches and/or posts may be formed by masking and selective etching. Alternatively, selective epitaxial growth, combinations of etching and growth, or other techniques may be used. The mask may be formed on the post tops after formation of the posts. The trenches may extend into the buffer layer and/or into the substrate so that the trench floors are in the buffer layer and preferably are in the silicon carbide substrate.

The sidewalls of the posts in the underlying gallium nitride layer are laterally grown into the trenches, to thereby form a lateral gallium nitride layer of lower defect density than that of the underlying gallium nitride layer. Some vertical growth may also occur in the trenches, although vertical growth from the post tops is reduced and preferably suppressed by the mask thereon. The laterally grown gallium nitride layer is vertically grown through the openings in the mask while propagating the lower defect density. As the height of the vertical growth extends through the openings in the mask, lateral growth over the mask occurs while propagating the lower defect density to thereby form an overgrown lateral gallium nitride layer on the mask.

Gallium nitride semiconductor structures according to the invention comprise a silicon carbide substrate and a plurality of gallium nitride posts on the silicon carbide substrate. The posts each include a sidewall and a top and define a plurality of trenches therebetween. A capping layer is provided on the tops of the posts. A lateral gallium nitride layer extends laterally from the sidewalls of the posts into the trenches. The lateral gallium nitride layer may also be referred to as a pendeoepitaxial gallium nitride layer. The lateral gallium nitride layer may be a continuous lateral gallium nitride layer that extends between adjacent sidewalls across the trenches therebetween.

The lateral gallium nitride layer may also extend vertically through the array of openings. An overgrown lateral gallium nitride layer may also be provided that extends laterally onto the capping layer. The overgrown lateral gallium nitride layer may be a continuous overgrown lateral gallium nitride layer that extends between the adjacent sidewalls across the capping layer therebetween.

A plurality of microelectronic devices may be provided in the lateral gallium nitride layer and/or in the overgrown lateral gallium nitride layer. A buffer layer may be included between the silicon carbide substrate and the plurality of posts. The trenches may extend into the silicon carbide substrate, into the buffer layer or through the buffer layer and into the silicon carbide substrate. The gallium nitride posts may be of a defect density, and the lateral gallium nitride layer and the overgrown lateral gallium nitride layer are of lower defect density than the defect density. Accordingly, low defect density gallium nitride semiconductor layers may be produced, to thereby allow the production of high performance microelectronic devices.

DETAILED DESCRIPTION OF PREFERRED EMBODIMENTS

Figure 1:
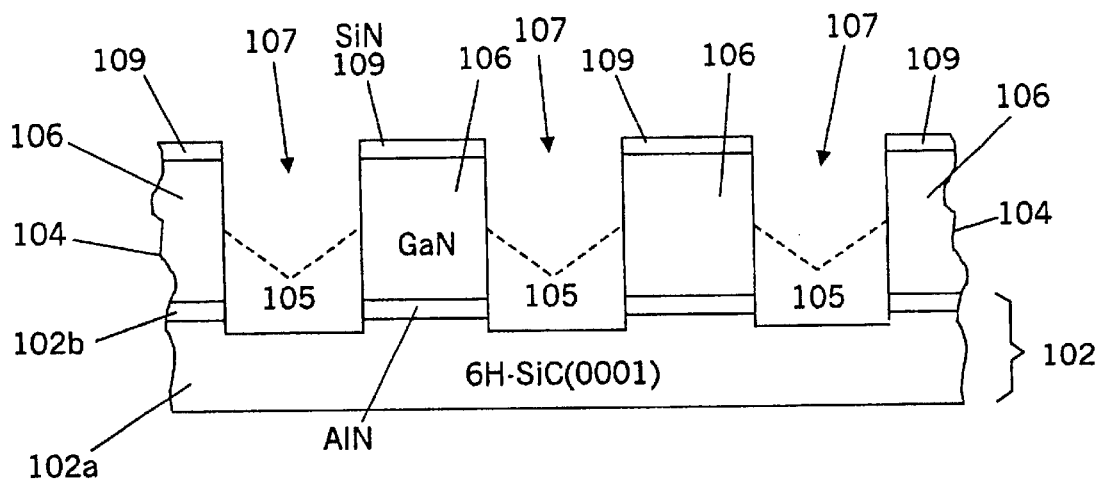
FIGS. 1–6 are cross-sectional views of gallium nitride semiconductor structures during intermediate fabrication steps according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" or "onto" another element, it can be directly on the other element or intervening elements may also be present. Moreover, each embodiment described and illustrated herein includes its complementary conductivity type embodiment as well.

Referring now to FIGS. 1–6, methods of fabricating gallium nitride semiconductor structures according to the present invention will now be described. As shown in FIG. 1, an underlying gallium nitride layer 104 is grown on a substrate 102. The substrate 102 may include a 6H-SiC (0001) substrate 102a and an aluminum nitride or other buffer layer 102b. The crystallographic designation conventions used herein are well known to those having skill in the art, and need not be described further. The underlying gallium nitride layer 104 may be between 0.5 and 2.0 μm thick, and may be grown at 1000° C. on a high temperature (1100° C.) aluminum nitride buffer layer 102b that was deposited on the 6H-SiC substrate 102a in a cold wall vertical and inductively heated metalorganic vapor phase epitaxy system using triethylgallium at 26 μmol/min, ammonia at 1500 sccm and 3000 sccm hydrogen diluent. Additional details of this growth technique may be found in a publication by T. W. Weeks et al. entitled "*GaN Thin Films Deposited Via Organometallic Vapor Phase Epitaxy on (6H)-SiC(0001) Using High-Temperature Monocrystalline AlN Buffer Layers*", Applied Physics Letters, Vol. 67, No. 3, Jul. 17, 1995, pp. 401–403, the disclosure of which is hereby incorporated herein by reference. Other silicon carbide substrates, with or without buffer layers, may be used.

Continuing with the description of FIG. 1, a mask such as a silicon nitride (SiN) mask 109 is included on the underlying gallium nitride layer 104. The mask 109 may have a thickness of about 1000Å and may be formed on the underlying gallium nitride layer 104 using low pressure chemical vapor deposition (CVD) at 410° C. The mask 109 is patterned to provide an array of openings therein, using conventional photolithography techniques.

As shown in FIG. 1, the underlying gallium nitride layer is etched through the array of openings to define a plurality of posts 106 in the underlying gallium nitride layer 104 and a plurality of trenches 107 therebetween. The posts each include a sidewall 105 and a top having the mask 109 thereon. It will also be understood that although the posts 106 and trenches 107 are preferably formed by masking and etching as described above, the posts may also be formed by selectively growing the posts from an underlying gallium nitride layer and then forming a capping layer on the tops of the posts. Combinations of selective growth and selective etching may also be used.

Still referring to FIG. 1, the underlying gallium nitride layer 104 includes a plurality of sidewalls 105 therein. It will be understood by those having skill in the art that the sidewalls 105 may be thought of as being defined by the plurality of spaced apart posts 106, that also may be referred to as "mesas", "pedestals" or "columns". The sidewalls 105 may also be thought of as being defined by the plurality of trenches 107, also referred to as "wells", in the underlying gallium nitride layer 104. The sidewalls 105 may also be thought of as being defined by a series of alternating trenches 107 and posts 106. As described above, the posts 106 and the trenches 107 that define the sidewalls 105 may be fabricated by selective etching and/or selective epitaxial growth and/or other conventional techniques. Moreover, it will also be understood that the sidewalls need not be orthogonal to the substrate 102, but rather may be oblique thereto.

It will also be understood that although the sidewalls 105 are shown in cross-section in FIG. 1, the posts 106 and trenches 107 may define elongated regions that are straight, V-shaped or have other shapes. As shown in FIG. 1, the trenches 107 may extend into the buffer layer 102b and into the substrate 102a, so that subsequent gallium nitride growth occurs preferentially on the sidewalls 105 rather than on the trench floors. In other embodiments, the trenches may not extend into the substrate 102a, and also may not extend into the buffer layer 102b, depending, for example, on the trench geometry and the lateral versus vertical growth rates of the gallium nitride.

Figure 2:
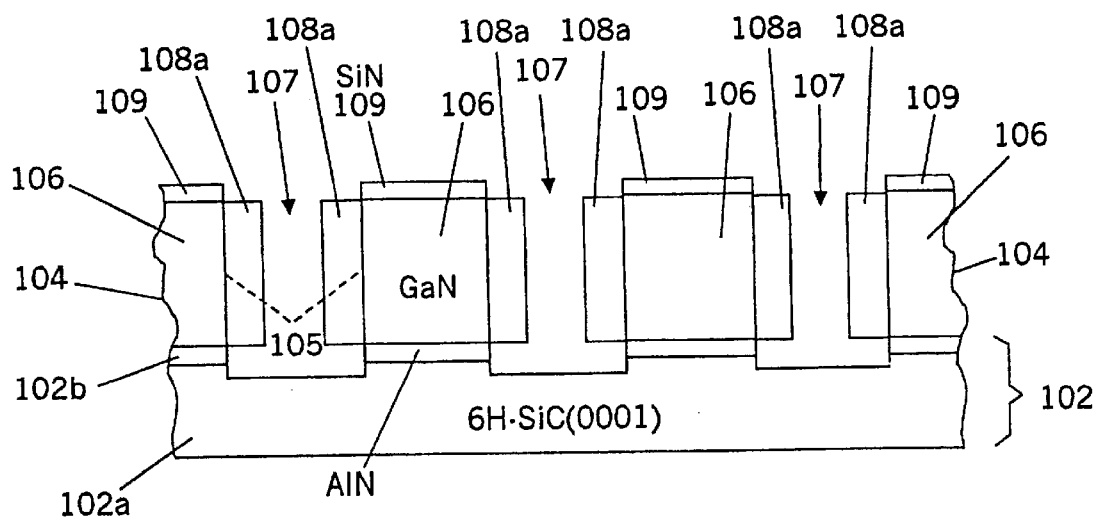

Referring now to FIG. 2, the sidewalls 105 of the underlying gallium nitride layer 104 are laterally grown to form a lateral gallium nitride layer 108a in the trenches 107. Lateral growth of gallium nitride may be obtained at 1000°–1100° C. and 45 Torr. The precursors TEG at 13–39 $\mu$mol/min and $NH_3$ at 1500 sccm may be used in combination with a 3000 sccm $H_2$ diluent. If gallium nitride alloys are formed, additional conventional precursors of aluminum or indium, for example, may also be used. As used herein, the term "lateral" means a direction that is parallel to the faces of the substrate 102. It will also be understood that some vertical growth of the lateral gallium nitride 108a may also take place during the lateral growth from the sidewalls 105. As used herein, the term "vertical" denotes a directional parallel to the sidewalls 105. However, it will be understood that growth and/or nucleation on the top of the posts 106 is reduced and is preferably eliminated by the mask 109.

Figure 3:
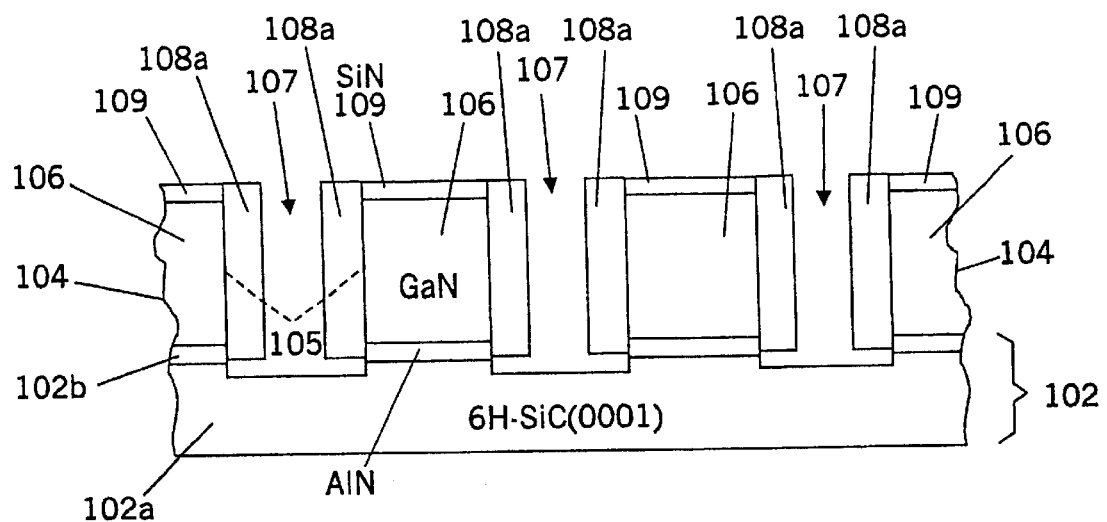

Referring now to FIG. 3, continued growth of the lateral gallium nitride layer 108a causes vertical growth of the lateral gallium nitride layer 108a through the array of openings. Conditions for vertical growth may be maintained as was described in connection with FIG. 2. As also shown in FIG. 3, continued vertical growth into trenches 107 may take place at the bottom of the trenches.

Figure 4:
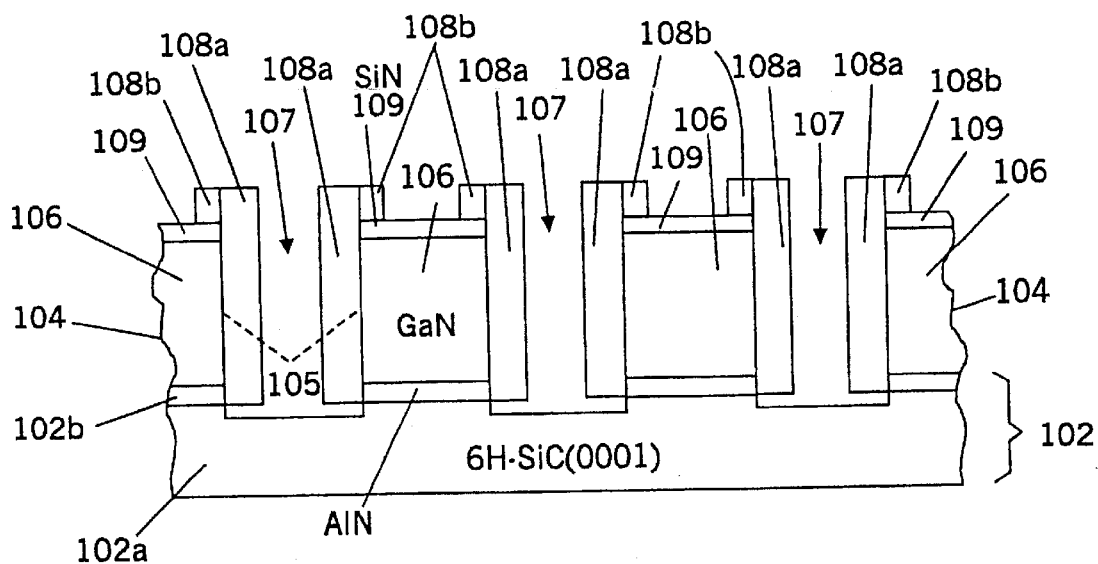

Referring now to FIG. 4, continued growth of the lateral gallium nitride layer 108a causes lateral overgrowth onto the mask 109, to form an overgrown lateral gallium nitride layer 108b. Growth conditions for overgrowth may be maintained as was described in connection with FIG. 2.

Figure 5:
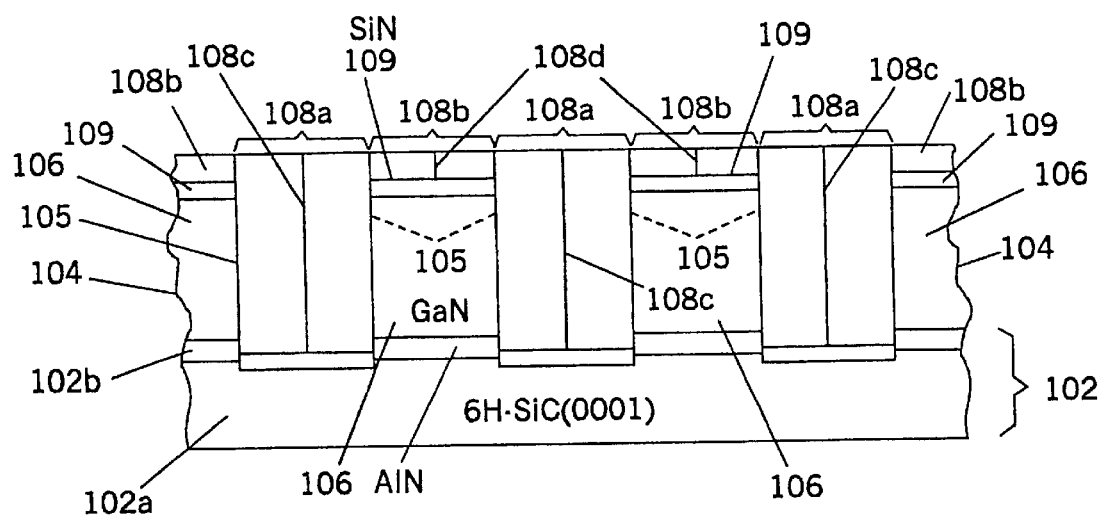

Referring now to FIG. 5, growth is allowed to continue until the lateral growth fronts coalesce in the trenches 107 at the interfaces 108c, to form a continuous lateral gallium nitride semiconductor layer 108a in the trenches.

Figure 6:
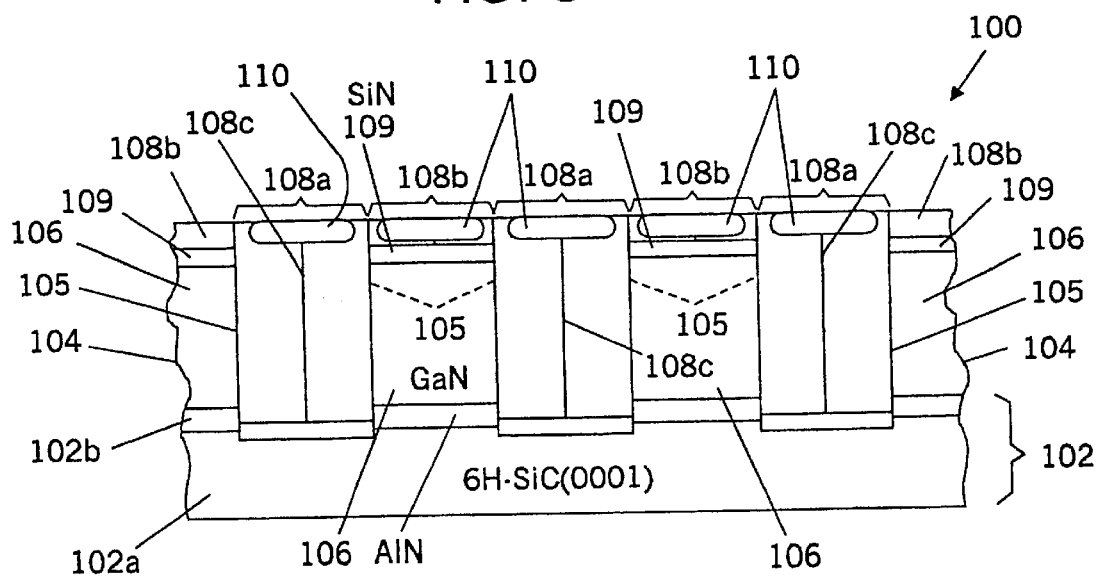

Still referring to FIG. 5, growth is also allowed to continue until the lateral overgrowth fronts coalesce over the mask 109 at the interfaces 108d, to form a continuous overgrown lateral gallium nitride semiconductor layer 108b. The total growth time may be approximately 60 minutes. A single continuous growth step may be used. As shown in FIG. 6, microelectronic devices 110 may then be formed in the lateral gallium nitride semiconductor layer 108a. Microelectronic devices also may be formed in the overgrown lateral gallium nitride layer 108b.

Accordingly, in FIG. 6, gallium nitride semiconductor structures 100 according to the present invention are illustrated. The gallium nitride structures 100 include the substrate 102. The substrate preferably includes the 6H-SiC (0001) substrate 102a and the aluminum nitride buffer layer 102b on the silicon carbide substrate 102a. The aluminum nitride buffer layer 102b may be 0.1 $\mu$m thick.

The fabrication of the substrate 102 is well known to those having skill in the art and need not be described further. Fabrication of silicon carbide substrates are described, for example, in U.S. Pat. Nos. 4,865,685 to Palmour; Re 34,861 to Davis et al.; 4,912,064 to Kong et al. and 4,946,547 to Palmour et al., the disclosures of which are hereby incorporated herein by reference.

The underlying gallium nitride layer 104 is also included on the buffer layer 102b opposite the substrate 102a. The underlying gallium nitride layer 104 may be between about 0.5 and 2.0 $\mu$m thick, and may be formed using metalorganic vapor phase epitaxy (MOVPE). The underlying gallium nitride layer generally has an undesired relatively high defect density. For example, dislocation densities of between about $10^8$ and $10^{10}$ cm$^{-2}$ may be present in the underlying gallium nitride layer. These high defect densities may result from mismatches in lattice parameters between the buffer layer 102b and the underlying gallium nitride layer 104, and/or other causes. These high defect densities may impact the performance of microelectronic devices formed in the underlying gallium nitride layer 104.

Still continuing with the description of FIG. 6, the underlying gallium nitride layer 104 includes the plurality of sidewalls 105 that may be defined by the plurality of posts 106 and/or the plurality of trenches 107. As was described above, the sidewalls may be oblique and of various elongated shapes. Also as was described above, the gallium nitride posts 106 are capped with a capping layer such as a mask 109, preferably comprising silicon nitride.

Continuing with the description of FIG. 6, the lateral gallium nitride layer 108a extends laterally and vertically from the plurality of sidewalls 105 of the underlying gallium nitride layer 104. The overgrown lateral gallium nitride 108b extends from the lateral gallium nitride layer 108a. The lateral gallium nitride layer 108a and the overgrown lateral gallium nitride layer 108b may be formed using metalorganic vapor phase epitaxy at about 1000°–1100° C. and about 45 Torr. Precursors of triethygallium (TEG) at about 13–39 $\mu$mol/min and ammonia ($NH_3$) at about 1500 sccm may be used in combination with an about 3000 sccm $H_2$ diluent, to form the lateral gallium nitride layer 108a and the overgrown lateral gallium nitride layer 108b.

As shown in FIG. 6, the lateral gallium nitride layer 108a coalesces at the interfaces 108c to form a continuous lateral gallium nitride semiconductor layer 108a in the trenches. It has been found that the dislocation densities in the underlying gallium nitride layer 104 generally do not propagate laterally from the sidewalls 105 with the same density as vertically from the underlying gallium nitride layer 104. Thus, the lateral gallium nitride layer 108a can have a relatively low dislocation defect density, for example less than about $10^4$ cm$^{-2}$. From a practical standpoint, this may be regarded as defect-free. Accordingly, the lateral gallium nitride layer 108a may form device quality gallium nitride semiconductor material. Thus, as shown in FIG. 6, microelectronic devices 110 may be formed in the lateral gallium nitride semiconductor layer 108a.

Still referring to FIG. 6, the overgrown lateral gallium nitride layer 108b coalesces at the interfaces 108d to form a continuous overgrown lateral gallium nitride semiconductor layer 108b over the masks. It has been found that the dislocation densities in the underlying gallium nitride layer 104 and of the lateral gallium nitride layer 108a generally do not propagate laterally with the same density as vertically from the underlying gallium nitride layer 104 and the lateral gallium nitride layer 108a. Thus, the overgrown lateral gallium nitride layer 108b also can have a relatively low defect density, for example less than about $10^4$ cm$^{-2}$. Accordingly, the overgrown lateral gallium nitride layer 108b may also form device quality gallium nitride semiconductor material. Thus, as shown in FIG. 6, microelectronic devices 110 may also be formed in the overgrown lateral gallium nitride semiconductor layer 108b.

Figure 7:
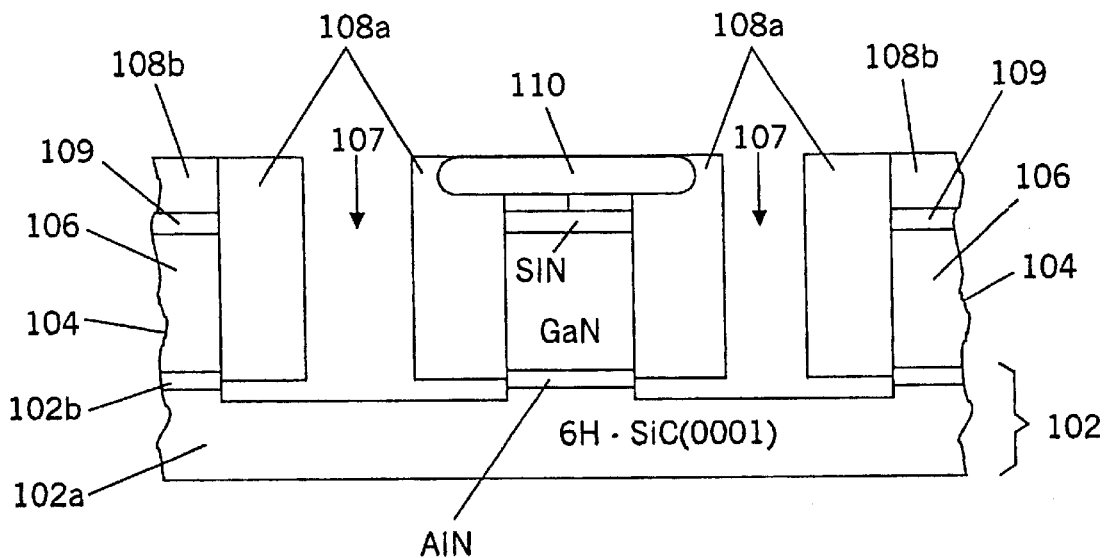
FIGS. 7 and 8 are cross-sectional views of other embodiments of gallium nitride semiconductor structures according to the present invention.
Figure 8:
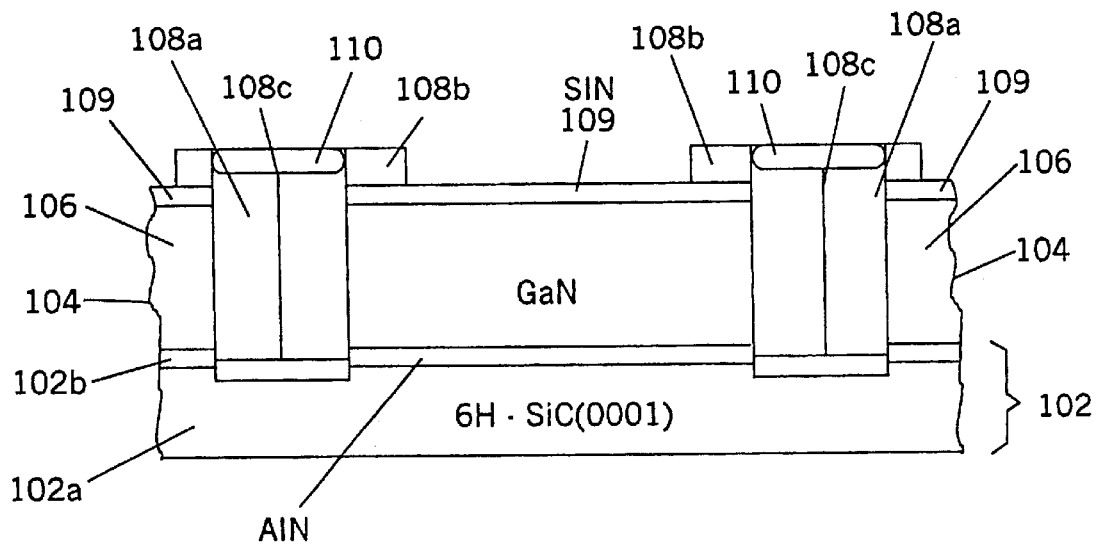

Referring now to FIGS. 7 and 8, other embodiments of gallium nitride semiconductor structures and fabrication methods according to the present invention will now be described. Gallium nitride structures are fabricated as was already described in connection with FIGS. 1–6 using different spacings or dimensions for the posts and trenches. In FIG. 7, a small post-width/trench-width ratio is used to produce discrete gallium nitride structures. In FIG. 8, a large post-width/trench-width ratio is used, to produce other discrete gallium nitride structures.

Referring now to FIG. 7, using a small post-width/trench-width ratio, gallium nitride semiconductor structures of FIG. 7 are fabricated as was already described in connection with FIGS. 1–4. Still referring to FIG. 7, growth is allowed to continue until the overgrown lateral fronts coalesce over the mask 109 at the interfaces 108d, to form a continuous overgrown lateral gallium nitride semiconductor layer over the mask 109. The total growth time may be approximately 60 minutes. As shown in FIG. 7, microelectronic devices 110 may be formed in the overgrown lateral gallium nitride layer 108b.

Referring now to FIG. 8, using a large post-width I trench-width ratio, gallium nitride semiconductor structures of FIG. 8 are fabricated as was already described in connection with FIGS. 1–4. Still referring to FIG. 8, growth is allowed to continue until the overgrown lateral fronts coalesce in the trenches 107 at the interfaces 108c, to form a continuous gallium nitride semiconductor layer 108a in the trenches 107. The total growth time may be approximately 60 minutes. As shown in FIG. 8, microelectronic devices 110 may be formed in the pendeoepitaxial gallium nitride layer 108a.

Additional discussion of methods and structures of the present invention will now be provided. The trenches 107 and are preferably rectangular trenches that preferably extend along the <11$\bar{2}$0> and/or <1$\bar{1}$00> directions on the underlying gallium nitride layer 104. Truncated triangular stripes having (1$\bar{1}$01) slant facets and a narrow (0001) top facet may be obtained for trenches along the <11$\bar{2}$0> direction. Rectangular stripes having a (0001) top facet, (11$\bar{2}$0) vertical side faces and (1$\bar{1}$01) slant facets may be grown along the <1$\bar{1}$00> direction. For growth times up to 3 minutes, similar morphologies may be obtained regardless of orientation. The stripes develop into different shapes if the growth is continued.

The amount of lateral growth generally exhibits a strong dependence on trench orientation. The lateral growth rate of the <1$\bar{1}$00> oriented is generally much faster than those along <11$\bar{2}$0>. Accordingly, it is most preferred to orient the trenches so that they extend along the <1$\bar{1}$00> direction of the underlying gallium nitride layer 104.

The different morphological development as a function of orientation appears to be related to the stability of the crystallographic planes in the gallium nitride structure. Trenches oriented along <11$\bar{2}$0> may have wide (1$\bar{1}$00) slant facets and either a very narrow or no (0001) top facet depending on the growth conditions. This may be because (1$\bar{1}$01) is the most stable plane in the gallium nitride wurtzite crystal structure, and the growth rate of this plane is lower than that of others. The {1$\bar{1}$01} planes of the <1$\bar{1}$00> oriented trenches may be wavy, which implies the existence of more than one Miller index. It appears that competitive growth of selected {1$\bar{1}$01} planes occurs during the deposition which causes these planes to become unstable and which causes their growth rate to increase relative to that of the (1$\bar{1}$01) of trenches oriented along <11$\bar{2}$0>.

The morphologies of the gallium nitride layers selectively grown from trenches oriented along <1$\bar{1}$00> are also generally a strong function of the growth temperatures. Layers grown at 1000° C. may possess a truncated triangular shape. This morphology may gradually change to a rectangular cross-section as the growth temperature is increased. This shape change may occur as a result of the increase in the diffusion coefficient and therefore the flux of the gallium species along the (0001) top plane onto the {1$\bar{1}$01} planes with an increase in growth temperature. This may result in a decrease in the growth rate of the (0001) plane and an increase in that of the {1$\bar{1}$01}. This phenomenon has also been observed in the selective growth of gallium arsenate on silicon dioxide. Accordingly, temperatures of 1100° C. appear to be most preferred.

The morphological development of the gallium nitride regions also appears to depend on the flow rate of the TEG. An increase in the supply of TEG generally increases the growth rate in both the lateral and the vertical directions. However, the lateral/vertical growth rate ratio decrease from about 1.7 at the TEG flow rate of about 13 $\mu$mol/min to 0.86 at about 39 $\mu$mol/min. This increased influence on growth rate along <0001> relative to that of <11$\bar{2}$0> with TEG flow rate may be related to the type of reactor employed, wherein the reactant gases flow vertically and perpendicular to the substrate. The considerable increase in the concentration of the gallium species on the surface may sufficiently impede their diffusion to the {1$\bar{1}$01} planes such that chemisorption and gallium nitride growth occur more readily on the (0001) plane.

Continuous 2 $\mu$m thick gallium nitride semiconductor layers may be obtained using 7 $\mu$m wide trenches spaced 3 $\mu$m apart and oriented along <1$\bar{1}$00>, at about 1100° C. and a TEG flow rate of about 26 $\mu$mol/min. Continuous 2 $\mu$m thick gallium nitride semiconductor layers may also be obtained using 3 µm wide trenches spaced 2 µm apart and oriented along <1$\bar{1}$00>, also at about 1100° C. and a TEG flow rate of about 26 µmol/min. The continuous gallium nitride semiconductor layers may include subsurface voids that form when two growth fronts coalesce. These voids may occur most often using lateral growth conditions wherein rectangular trenches and/or mask openings having vertical {11$\bar{2}$0} side facets developed.

The continuous gallium nitride semiconductor layers may have a microscopically flat and pit-free surface. The surfaces of the laterally grown gallium nitride layers may include a terrace structure having an average step height of 0.32 nm. This terrace structure may be related to the laterally grown gallium nitride, because it is generally not included in much larger area films grown only on aluminum nitride buffer layers. The average RMS roughness values may be similar to the values obtained for the underlying gallium nitride layer 104.

Threading dislocations, originating from the interface between the underlying gallium nitride layer 104 and the buffer layer 102b, appear to propagate to the top surface of the underlying gallium nitride layer 104. The dislocation density within these regions is approximately $10^9$ cm$^{-2}$. By contrast, threading dislocations do not appear to readily propagate laterally. Rather, the lateral gallium nitride layer 108a and the overgrown lateral gallium nitride layer 108b contain only a few dislocations. In the lateral gallium nitride layer 108a, the few dislocations may be formed parallel to the (0001) plane via the extension of the vertical threading dislocations after a 90° bend in the regrown region. These dislocations do not appear to propagate to the top surface of the overgrown gallium nitride layer.

As described, the formation mechanism of the selectively grown gallium nitride layers is lateral epitaxy. The two main stages of this mechanism are lateral (or pendeoepitaxial) growth and lateral overgrowth. During pendeoepitaxial growth, the gallium nitride grows simultaneously both vertically and laterally. The deposited gallium nitride grows selectively on the sidewalls more rapidly than it grows on the mask 109, apparently due to the much higher sticking coefficient, s, of the gallium atoms on the gallium nitride sidewall surface (s=1) compared to on the mask (s<<1) and substrate (s<1). Ga or N atoms should not readily bond to the mask and substrate surface in numbers and for a time sufficient to cause gallium nitride nuclei to form. They would either evaporate or diffuse along the mask and substrate surface to the ends of the mask or substrate and onto the sidewalls. During lateral overgrowth, the gallium nitride also grows simultaneously both vertically and laterally. Once the pendeoepitaxial growth emerges over the masks, Ga or N atoms should still not readily bond to the mask surface in numbers and for a time sufficient to cause gallium nitride nuclei to form. They would still either evaporate or diffuse along the mask to the ends of the mask and onto the pendeoepitaxial gallium nitride vertical surfaces.

Surface diffusion of gallium and nitrogen on the gallium nitride may play a role in gallium nitride selective growth. The major source of material appears to be derived from the gas phase. This may be demonstrated by the fact that an increase in the TEG flow rate causes the growth rate of the (0001) top facets to develop faster than the (1$\bar{1}$01) side facets and thus controls the lateral growth.

In conclusion, pendeoepitaxial and lateral epitaxial overgrowth may be obtained from sidewalls of an underlying masked gallium nitride layer via MOVPE. The growth may depend strongly on the sidewall orientation, growth temperature and TEG flow rate. Coalescence of pendeoepitaxial grown and lateral overgrown gallium nitride regions to form regions with both extremely low densities of dislocations and smooth and pit-free surfaces may be achieved through 3 µm wide trenches between 2 µm wide posts and extending along the <1$\bar{1}$00> direction, at about 1100° C. and a TEG flow rate of about 26 µmol/min. The pendeoepitaxial and lateral overgrowth of gallium nitride from sidewalls via MOVPE may be used to obtain low defect density regions for microelectronic devices over the entire surface of the thin film.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of fabricating a gallium nitride semiconductor layer comprising the steps of:
   masking an underlying gallium nitride layer on a silicon carbide substrate with a mask that includes an array of openings therein;
   etching the underlying gallium nitride layer through the array of openings to define a plurality of posts in the underlying gallium nitride layer and a plurality of trenches therebetween, the posts each including a sidewall and a top having the mask thereon; and
   laterally growing the sidewalls of the posts into the trenches to thereby form a gallium nitride semiconductor layer.

2. A method according to claim 1 wherein the step of laterally growing comprises the step of laterally growing the sidewalls of the posts into the trenches until the laterally grown sidewalls coalesce in the trenches to thereby form a gallium nitride semiconductor layer.

3. A method according to claim 1 wherein the step of laterally growing comprises the step of laterally overgrowing the laterally grown sidewalls of the posts in the trenches onto the mask on the tops of the posts, to thereby form a gallium nitride semiconductor layer.

4. A method according to claim 3 wherein the step of laterally growing comprises the step of laterally overgrowing the laterally grown sidewalls of the posts in the trenches onto the mask on the tops of the posts until the laterally grown sidewalls coalesce on the mask, to thereby form a gallium nitride semiconductor layer.

5. A method according to claim 1 wherein the laterally growing step is followed by the step of forming microelectronic devices in the gallium nitride semiconductor layer.

6. A method according to claim 1 wherein the laterally growing step comprises the step of laterally growing the sidewalls of the posts into the trenches using metalorganic vapor phase epitaxy.

7. A method according to claim 1 wherein the masking step comprises the step of masking an underlying gallium nitride layer on a buffer layer on a silicon carbide substrate with a mask that includes an array of openings therein.

8. A method according to claim 1 wherein the etching step comprises the step of etching the underlying gallium nitride layer and the silicon carbide substrate through the array of openings to define a plurality of posts in the underlying gallium nitride layer and a plurality of trenches therebetween, the posts each including a sidewall and a top having the mask thereon, the trenches including trench floors in the silicon carbide substrate.

9. A method according to claim 7 wherein the etching step comprises the step of etching the underlying gallium nitride layer, the buffer layer and the silicon carbide substrate through the array of openings to define a plurality of posts in the underlying gallium nitride layer and a plurality of trenches therebetween, the posts each including a sidewall and a top having the mask thereon, the trenches including trench floors in the silicon carbide substrate.

10. A method according to claim 1 wherein the masking step comprises the step of masking the underlying gallium nitride layer on a silicon carbide substrate with a mask that includes an array of stripe openings therein, the stripe openings extending along a <1100> direction of the underlying gallium nitride layer.

11. A method according to claim 1 wherein the underlying gallium nitride layer includes a defect density, and wherein the laterally growing step comprises the step of laterally growing the sidewalls of the posts into the trenches to thereby form a gallium nitride semiconductor layer of lower defect density than the defect density.

12. A method according to claim 1 wherein the masking step is preceded by the step of forming an underlying gallium nitride layer on a silicon carbide substrate.

13. A method according to claim 7 wherein the masking step is preceded by the steps of:
    forming a buffer layer on a silicon carbide substrate; and
    forming an underlying gallium nitride layer on a buffer layer, opposite the silicon carbide substrate.

14. A method of fabricating a gallium nitride semiconductor layer comprising the steps of:
    providing a silicon carbide substrate, a gallium nitride layer on the silicon carbide substrate and a capping layer on the gallium nitride layer opposite the silicon carbide substrate, the gallium nitride layer including a plurality of posts and a plurality of trenches therebetween, the trenches defining a plurality of openings in the capping layer;
    laterally and vertically growing sidewalls of the posts into the trenches and through the openings in the capping layer to thereby form a lateral gallium nitride layer in the trenches that extends vertically through the openings in the capping layer; and
    laterally overgrowing the lateral gallium nitride layer that extends through the openings in the capping layer onto the capping layer to thereby form an overgrown lateral gallium nitride layer.

15. A method according to claim 14 wherein the steps of laterally and vertically growing the sidewalls and laterally overgrowing the lateral gallium nitride layer are performed without vertically growing gallium nitride on the capping layer.

16. A method according to claim 14 wherein the step of laterally overgrowing the lateral gallium nitride layer comprises the step of laterally overgrowing the lateral gallium nitride layer that extends through the openings in the capping layer onto the capping layer until the overgrown lateral gallium nitride layer coalesces on the capping layer to thereby form a continuous overgrown lateral gallium nitride layer.

17. A method according to claim 14 wherein the step of laterally overgrowing the lateral gallium nitride layer is followed by the step of forming microelectronic devices in the overgrown lateral gallium nitride layer.

18. A method according to claim 14 wherein the providing step comprises the steps of:
    masking an underlying gallium nitride layer on a silicon carbide substrate with a mask that includes an array of openings therein;
    etching the underlying gallium nitride layer through the array of openings to define a plurality of posts in the gallium nitride layer and a plurality of trenches therebetween, the posts each including a sidewall and a top having the mask thereon to provide the capping layer.

19. A method according to claim 18 wherein the masking step comprises the step of masking an underlying gallium nitride layer on a buffer layer on a silicon carbide substrate with a mask that includes an array of openings therein.

20. A method according to claim 18 wherein the etching step comprises the step of etching the underlying gallium nitride layer and the silicon carbide substrate through the array of openings to define a plurality of posts in the underlying gallium nitride layer and a plurality of trenches therebetween, the posts each including a sidewall and a top having the mask thereon, the trenches including trench floors in the silicon carbide substrate.

21. A method according to claim 19 wherein the etching step comprises the step of etching the underlying gallium nitride layer, the buffer layer and the silicon carbide substrate through the array of openings to define a plurality of posts in the underlying gallium nitride layer and a plurality of trenches therebetween, the posts each including a sidewall and a top having the mask thereon, the trenches including trench floors in the silicon carbide substrate.

22. A method according to claim 14 wherein the underlying gallium nitride layer includes a defect density, and wherein the laterally and vertically growing step comprises the step of laterally and vertically growing the sidewalls of the posts into the trenches and through the openings in the capping layer to thereby form a lateral gallium nitride semiconductor layer of lower defect density than the defect density.

23. A method according to claim 1 wherein the laterally growing step is followed by the step of forming a microelectronic device in the lateral gallium nitride semiconductor layer.

24. A method according to claim 1 wherein the sidewalls are orthogonal to the silicon carbide substrate.

25. A method according to claim 1 wherein the sidewalls are oblique to the silicon carbide substrate.

26. A method according to claim 14 wherein the laterally overgrowing step is followed by the step of forming a microelectronic device in the overgrown lateral gallium nitride semiconductor layer.

27. A method according to claim 14 wherein the sidewalls are orthogonal to the silicon carbide substrate.

28. A method according to claim 14 wherein the sidewalls are oblique to the silicon carbide substrate.

29. A method according to claim 1 wherein the trenches include trench floors and wherein the step of laterally growing comprises the step of laterally growing the sidewalls of the posts into the trenches, spaced apart from the trench floors, to thereby form a cantilevered later gallium nitride semiconductor layer.

30. A method according to claim 14 wherein the trenches include trench floors and wherein the step of laterally and vertically growing comprises the step of laterally and vertically growing sidewalls of the posts into the trenches, spaced apart from the trench floors.

31. A method according to claim 1 wherein the masking step comprises the step of masking the underlying gallium nitride layer on a silicon carbide substrate with a mask that includes an array of stripe openings therein, the stripe openings extending along a <11$\bar{2}$0> direction of the underlying gallium nitride layer.

32. A method according to clam 1 wherein the masking step comprises the step of:

masking the underlying gallium nitride layer with a make that includes an array of first stripe openings therein that extend along a <11$\bar{2}$0> direction of the underlying gallium nitride layer, and an array of second stripe openings therein that extend along a <1$\bar{1}$00> direction of the underlying nitride layer.

33. A method according to claim 32 wherein the array of first stripe openings and the array of second stripe openings are arranged in a rectangle on the underlying gallium nitride layer, the rectangular having edges of predetermined lengths, and wherein a ratio of the predetermined lengths is proportional to a ratio of growth rates of a {11$\bar{2}$0} facet and a {1$\bar{1}$01} facet of the underlying gallium nitride layer during the growing up step.

34. A method according to claim 11 wherein the predetermined defect density is at least $10^8$ cm$^{-2}$ and wherein the lower defect density is less than $10^4$ cm$^{-2}$.

35. A method according to claim 22 wherein the predetermined defect density is at least $10^8$ cm$^{-2}$ and wherein the lower defect density is less that $10^4$ cm$^{-2}$.

36. A method according to claim 11 wherein the predetermined defect density is at least $10^8$ cm$^{-2}$ and wherein the lower defect density is less than $10^8$ cm$^{-2}$.

37. A method according to claim 22 wherein the predetermined defect density is at least $10^8$ cm$^{-2}$ and wherein the lower defect density is less than $10^8$ cm$^{-2}$.

38. A method according to claim 11 wherein the lower defect density is at least four orders of magnitude lower that the predetermined defect density.

39. A method according to claim 22 wherein the lower defect density is at least four orders of magnitude lower than the predetermined defect density.

* * * * *

UNITED STATES PATENT AND TRADEMARK OFFICE
CERTIFICATE OF CORRECTION

PATENT NO.   : 6,376,339 B2
DATED         : April 23, 2002
INVENTOR(S)  : Linthicum et al.

It is certified that error appears in the above-identified patent and that said Letters Patent is hereby corrected as shown below:

Title page,
Item [54], Title, please delete ", AND GALLIUM NITRIDE SEMICONDUCTOR STRUCTURES FABRICATED THEREBY"

Column 13,
Line 3, change "make" to -- mask --.

Signed and Sealed this

Thirteenth Day of July, 2004

JON W. DUDAS
*Acting Director of the United States Patent and Trademark Office*